United States Patent [19]

Ismail et al.

[11] Patent Number: 5,808,344
[45] Date of Patent: Sep. 15, 1998

[54] SINGLE-TRANSISTOR LOGIC AND CMOS INVERTERS

[75] Inventors: Khalid EzzEldin Ismail, White Plains; Bernard S. Meyerson, Yorktown Heights, both of N.Y.

[73] Assignee: International Business Machines Corporation, Armonk, N.Y.

[21] Appl. No.: 795,714

[22] Filed: Feb. 4, 1997

Related U.S. Application Data

[60] Provisional application No. 60/032,731 Dec. 13, 1996.
[51] Int. Cl.$^6$ ............................ H01L 29/76; H01L 29/74; H01L 31/111
[52] U.S. Cl. .......................... 257/369; 257/139; 257/141
[58] Field of Search ................................ 257/139, 140, 257/141, 350, 364, 371

[56] References Cited

U.S. PATENT DOCUMENTS 5,315,143  5/1994  Tsuji ......................... 257/369
5,534,713  7/1996  Ismail et al. ..................... 257/24

Primary Examiner—Wael Fahmy
Attorney, Agent, or Firm—Robert M. Trepp

[57] ABSTRACT

A dual transistor CMOS inverter can be built wherein a single gate is shared by two MOS transistors but only one transistor can be turned on at a time. A CMOS inverter function is provided. Further, a dual transistor logic function is described incorporating a combination of a lateral bipolar transistor (LBT) and a metal-oxide-semiconductor transistor (MOST). The gate of the MOST is used to turn on and off the base of the LBT. When the base is turned on, the LBT is turned on and off depending on the base voltage. This device has, thus, two inputs and can perform logic functions such as OR or NAND, which would typically require four transistors. The invention solves the problem of device density to perform logic by forming stacked devices with shared electrodes.

16 Claims, 5 Drawing Sheets

SINGLE-TRANSISTOR LOGIC AND CMOS INVERTERS

The present application claims priority to co-pending provisional application Ser. No. 60/032,731 filed Dec. 13, 1996.

FIELD OF THE INVENTION

This invention relates generally to semiconductor devices, and more particularly to metal-oxide-semiconductor field effect transistors and lateral bipolar transistors.

BACKGROUND OF THE INVENTION

CMOS circuits are the dominant technology for logic and digital applications. The continuous improvement in the basic CMOS devices is attributed to scaling of the device dimensions which results in higher speed and lower capacitance. However, further scaling beyond 0.1 $\mu$m gate length is questionable, because of various limitations such as short channel effects, gate oxide integrity, and shallow contact formation.

The design of logic gates based on Si CMOS has always relied on the basic inverter cell, consisting of two transistors, one n-MOS and one p-MOS combined in the complementary structure, and on derivatives of that such as OR, AND, etc. Any two-input AND or OR gate requires four transistors. Thus scaling of MOS transistors results in a corresponding decrease in transistor area and device wiring capacitance.

While lateral bipolar devices are known in the art, they are not used in combination with MOS transistors to implement high density logic.

SUMMARY OF THE INVENTION

In accordance with the present invention, a dual MOS transistor structure and method for making is described comprising a substrate, a first layer of n type semiconductor material having first and second spaced apart p type regions forming source and drain regions, respectively, a second buffer layer over the first layer, a third layer of p type semiconductor material over the buffer layer having third and fourth spaced apart n type regions forming source and drain regions, respectively, a fourth dielectric layer over the third layer, and a gate electrode over the fourth dielectric layer, the gate electrode being positioned over a path between the first and second p type regions and a path between the third and fourth n type regions. The gate electrode is a common gate to an n type transistor and a p type transistor formed one above the other. The drain of one may be coupled to the drain of the other transistor to form a CMOS inverter.

The invention further provides a gate controlled lateral bipolar transistor comprising a substrate, a first layer of n type semiconductor material, a second layer of p type semiconductor material, a third layer of dielectric material, a gate electrode formed on the third layer, first and second spaced apart regions of a first conductivity type formed in the first and second layers on either side of the gate electrode to function as the emitter and collector respectively of a lateral bipolar transistor, and a third region of a second conductivity formed in the first and second layers positioned on a side of the gate electrode to function as a source of an MOS transistor. The gate controlled lateral bipolar transistor with appropriate voltages can perform OR and NAND logic functions.

It is therefore an object of the invention to increase the packing density and to reduce the device wiring capacitance by adding logic functionality to the single transistor without adding substantially to the transistor area.

It is therefore a further object of the invention to provide logic functionality by stacking transistors, one over the other with interaction therebetween wherein the transistors are MOS transistors or MOS transistors and lateral bipolar transistors.

It is therefore a further object of the invention to provide respective semiconductor layers for respective transistors.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1:
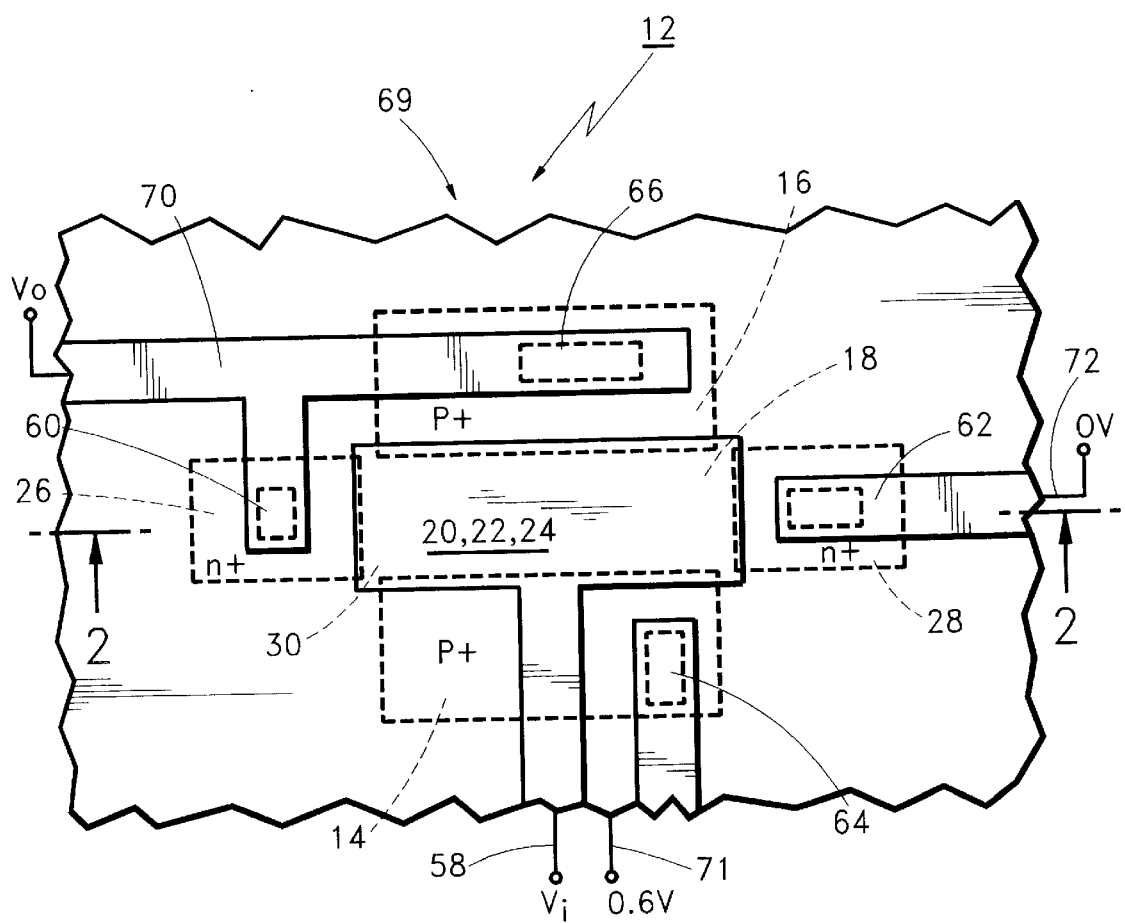
FIG. 1 is a top view of one embodiment of the invention.
Figure 2:
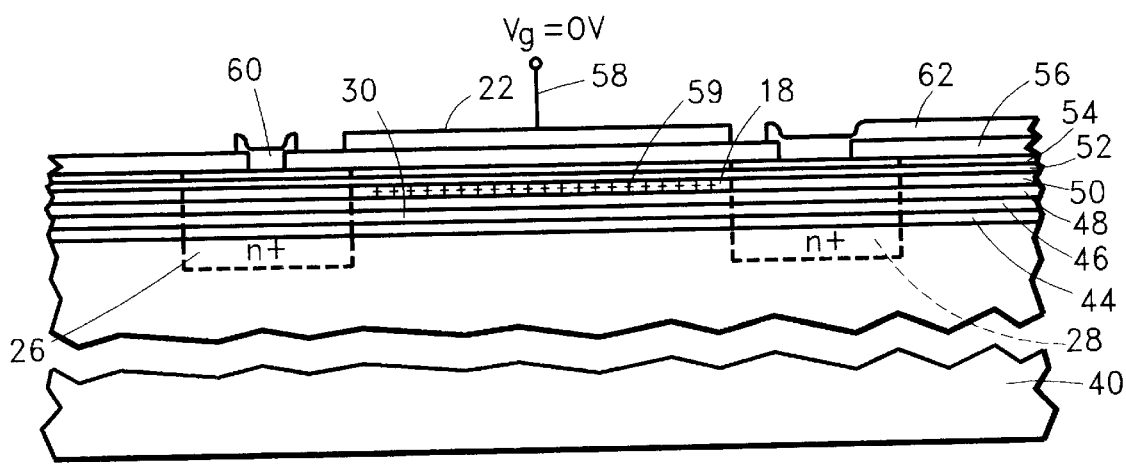
FIG. 2 is a cross section view along the line 2—2 of FIG. 1 showing the conducting p channel with a gate voltage of 0 volts.

Referring now to the drawing, FIG. 1 shows a top view of dual MOS transistor 12. FIG. 2 shows a cross section view along the line 2—2 of FIG. 1. $P^+$ type regions 14 and 16 are spaced apart to define a channel 18 for a p type transistor 20. Regions 14 and 16 correspond to the source and drain, respectively, of p type transistor 20. Gate electrode 22 which may be for example polysilicon or Al forms the gate of transistor 20 and also the gate of an n type transistor 24. N type transistor 24 has a drain 26 and source 28 which are spaced apart $n^+$ type regions to define channel 30 therebetween. As shown in FIG. 1, $n^+$ type regions 26 and 28 are formed on opposite sides of channel 30 with the leading edges parallel to each other and $P^+$ type regions 14 and 16 are formed on opposite sides of channel 18 with the leading edges of the regions parallel to each other. The leading edges of the regions are on the sides of a geometric polygon, rectangle, or square. Gate electrode 22 is common to both channels and is positioned over a path between $n^+$ type regions 24 and 26 and a path between $p^+$ type regions 14 and 16 to provide a conductive path between respective regions at times an appropriate gate voltage is applied to cause holes or electrons to form in the respective transistor channel 18 or 30.

Referring to FIG. 2, a substrate 40 which may be for example Si or SiGe has a layer 44 of SiGe thereover. A layer 46 of strained Si or strained SiGe is deposited thereover. The strain is caused by lattice mismatch between Si and SiGe. Layers 44 and 46 may be formed by depositing layers of SiGe and Si as described in U.S. Pat. No. 5,534,713 which issued on Jul. 9, 1996 to K. Ismail, the inventor herein, and F. Stern, and assigned in part to the assignee herein. U.S. Pat. No. 5,534,713 is incorporated herein by reference to show how to form strained layers of Si and SiGe to achieve higher electron and hole mobility, respectively, in respective channels 30 and 18. The strain may place a layer under compression or under tension depending on the lattice spacing of the adjacent layers. It is desirable for the n channel of an n type transistor to be under tension and for the p channel of a p type transistor to be under compression. Ge has a lattice spacing of about 1.04 with respect to the lattice spacing of Si. Thus SiGe has a larger lattice spacing than Si. The lattice spacing of SiGe is between that of Si and Ge and is proportional to the composition of Ge in atomic percent.

Above layer 46 is a layer 48 of SiGe where Ge is about 30 atomic percent. Above layer 48 is a layer 50 of SiGe where Ge is about 70 atomic percent. Layer 50 is thus under compression. Above layer 50 is a layer 52 of SiGe where Ge is about 30 atomic percent. Above layer 52 is an epitaxial layer 54 of Si. A layer 56 of dielectric may be formed on layer 54 such as silicon dioxide formed by CVD of TEOS or by thermal oxidation of a portion of layer 54. Layer 56 functions as the gate dielectric of transistors 20 and 24 of dual transistor 12. Gate electrode 22 is formed above layer 56.

Ohmic contact to $n^+$ regions 26 and 28 as well as to $p^+$ regions 14 and 16 may be made by forming openings in silicon dioxide layer 56 above the respective regions and depositing a blanket layer of conductive material such as Al. The blanket layer of Al is subsequently patterned to form drain and source contacts 60 and 62 for n type transistor 24 and drain and source contacts 66 and 64 for p type transistor 20.

With a 0 volt signal applied over lead 58 to gate 22, holes 59 are drawn into channel 18 in layer 50 of transistor 20 as shown in FIG. 2 and hole current can flow between p+ regions 14 and 16 shown in FIG. 1. No electrons are drawn into channel 30.

Figure 3:
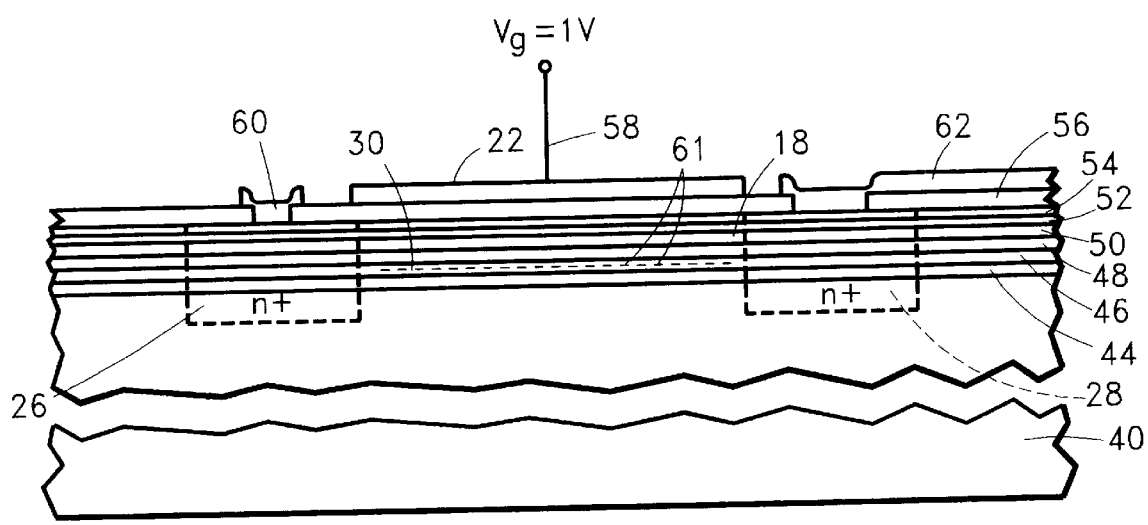
FIG. 3 is a cross section view along the line 2—2 of FIG. 1 showing the conducting n channel with a gate voltage of 1 volt.

With a 1 volt signal applied over lead 58 to gate 22, channel 18 is depleted of holes and no current flows between p+ regions 14 and 16 shown in FIG. 1. However, with the 1 volt signal applied to gate 22, electrons are drawn into channel 30 in layer 46 of transistor 24. Electron current can flow between N+ regions 26 and 28 as shown in FIG. 3. FIG. 3 is the same as FIG. 2 except for the showing of electrons 61 in channel 30 corresponding to a 1 volt signal on gate 22.

Figure 4:
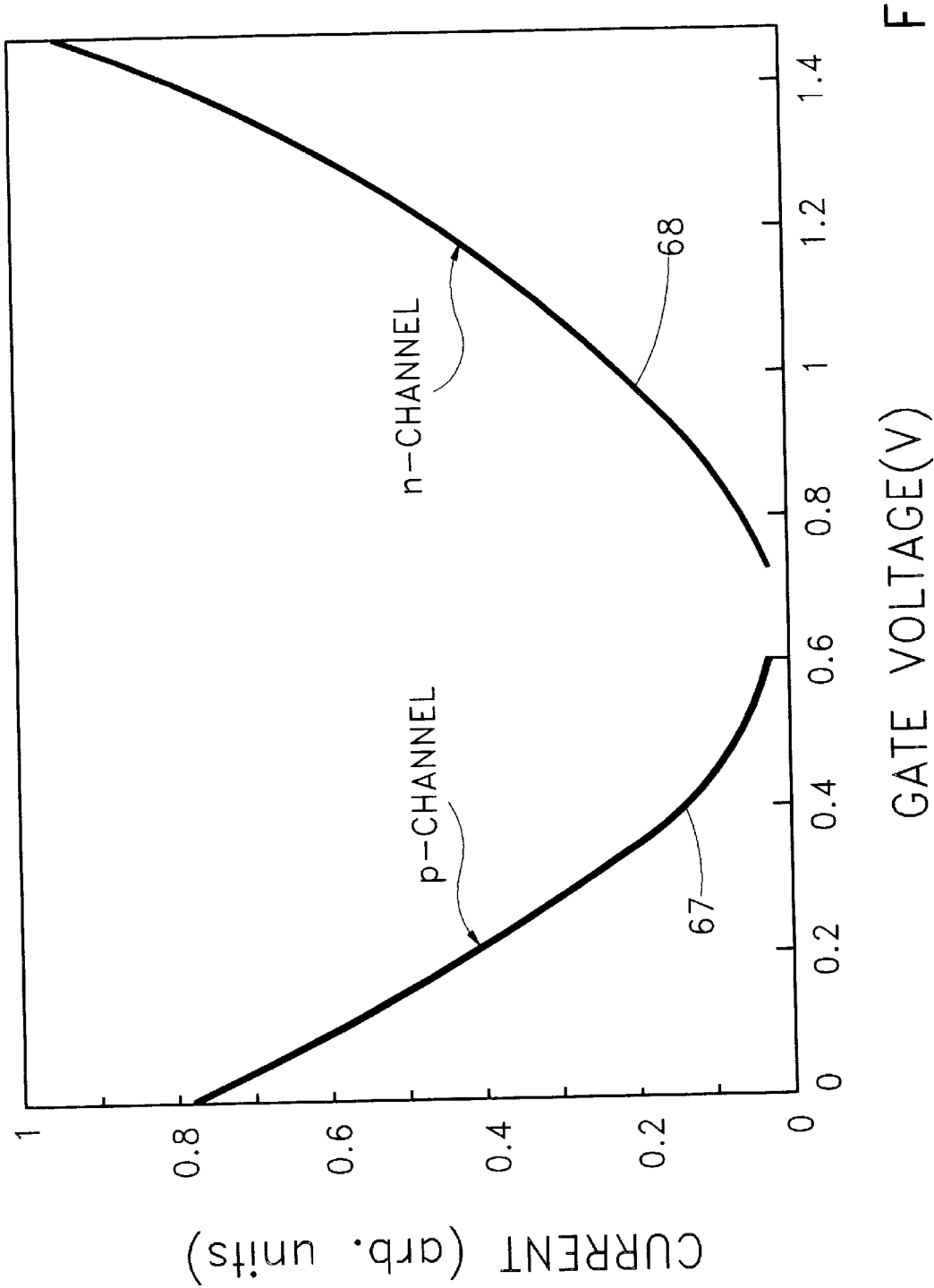
FIG. 4 is a graph of the current versus gate voltage for p and n channel MOS transistors built according to FIGS. 1 and 2.

FIG. 4 is a graph of the current versus gate voltage for p and n channel MOS transistors 24 and 20. In FIG. 4, the ordinate represents current in arbitrary units and the abscissa represents gate voltage in volts. Curve 67 shows the current versus gate voltage for transistor 20 and curve 68 shows the current versus gate voltage for transistor 24. As shown in FIG. 4, only negligible current will flow in one transistor when the other transistor is fully conducting.

Dual transistor 12 may be interconnected to form a complementary metal oxide semiconductor (CMOS) circuit 69 as shown in FIG. 1. Gate electrode 22 is connected to an input terminal 58. The drain contacts 60 and 66 of transistors 20 and 24 respectively are connected together by lead 70 and functions as an output terminal. The source of transistor 20, source contact 64, may be coupled over lead 71 to a voltage source or supply such as 1.0 or 0.6 volts. The source of transistor 24, source contact 62, may be coupled over lead 72 to a voltage source or supply such as ground or 0 volts.

In operation of CMOS circuit 69 shown in FIG. 1, an input signal is applied to gate 22 of transistors 20 and 24 switching one of them on and the other off. The output signal is on lead 70. Since gate 22 is shared by transistors 20 and 24, the voltage on gate 22 controls which channel is turned on. Thus CMOS circuit 69 achieves complementary logic the same way a conventional two transistor CMOS inverter would do. One difference is that only one gate electrode is used in this case with the n and p channels stacked one above the other; hence, the packing density of CMOS can be increased, and the gate and drain wiring capacitance can be reduced. It is preferable for the p channel to be above the n channel to enable the p channel to be closer to gate 22 to increase the p channel mobility.

Figure 5:
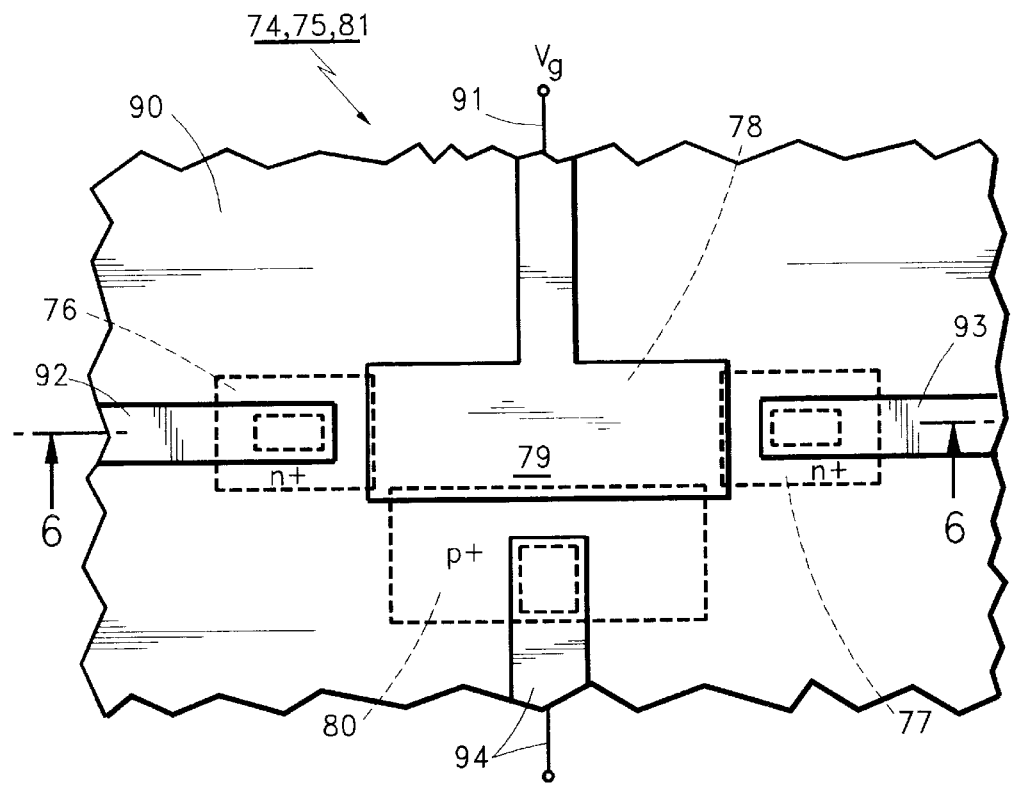
FIG. 5 is a top view of a second embodiment of the invention.
Figure 6:
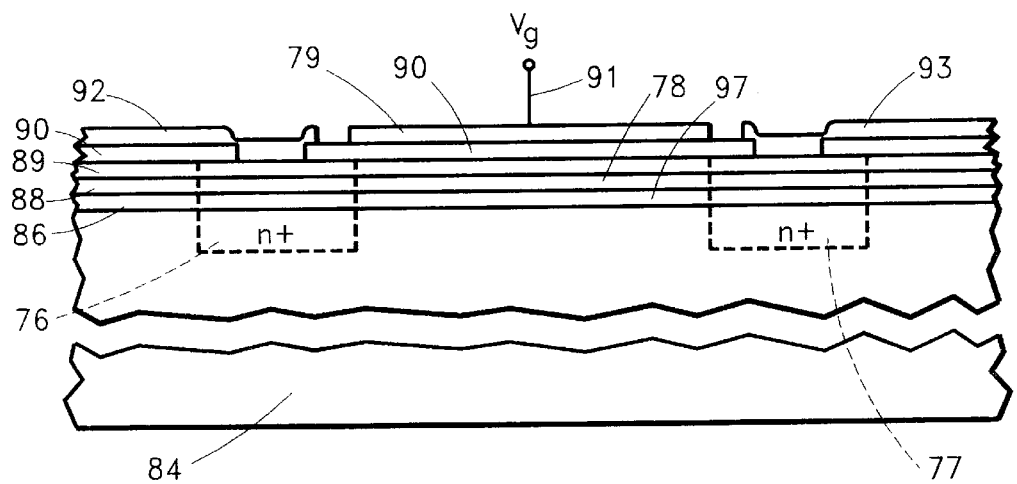
FIG. 6 is a cross section view along the line 6—6 of FIG. 5.

Referring to FIG. 5, a gate-controlled lateral bipolar transistor 74 is shown. FIG. 6 is a cross section view along the line 6—6 of FIG. 5. Gate-controlled lateral bipolar transistor 74 is based on Si/SiGe heteroepitaxy, which is a combination of a lateral bipolar transistor (LBT) 81 and a metal-oxide-semiconductor (MOS) transistor 75. Regions 76 and 77 form the emitter and collector of lateral bipolar transistor 74 and may be doped n+. The space between regions 76 and 77 functions to form the channel 78 of MOS transistor 75 and at the same time the base 78 of lateral bipolar transistor 81. Gate electrode 79 extends along a path or extends between regions 76 and 77. Region 80 which may be p+ forms the source or drain of MOS transistor 75 and provides a conductive path to supply majority carriers, holes, to base and/or channel 78.

Referring to FIG. 6, substrate 84 may be a semiconductor material, for example, Si or SiGe. Substrate 84 has an epitaxial semiconductor layer 86 of Si or SiGe thereover to form n channel 97. Above layer 86 is an epitaxial semiconductor layer 88 of semiconductor material such as SiGe for a base and/or a p channel 78. Above semiconductor layer 88 is a semiconductor layer 89 of Si which may have had its upper surface oxidized to form dielectric layer 90 of silicon dioxide; or, layer 90 may be of other suitable gate dielectric material. Above dielectric layer 90 is gate electrode 79 which may be, for example, heavily doped polysilicon or Al which is patterned after a blanket layer has been deposited. Gate electrode 79 may be coupled over lead 91 to an input signal $V_G$. Regions 76, 77 and 80 may be formed by ion implantation which may be self aligned with respect to gate electrode 79. Openings may be formed in dielectric layer 90 above regions 76, 77, and 80 so that ohmic contact may be made thereto via leads 92, 93, and 94, respectively.

In operation of gate-controlled bipolar junction transistor 74, the voltage on lead 91 of gate 79, determines whether p channel 78, layer 88, or n channel 97, layer 86, is turned on or conducting. The other channel not turned on is off or non-conducting. If the channel that is turned on is used as base 78 of lateral npn bipolar transistor 81, then base 78, layer 88, will be either conducting or not, depending on the gate voltage on lead 91. Lateral npn bipolar transistor 74 will be on if the voltage $V_G$ on lead 91 is zero volts and the voltage $V_B$ on lead 94 is positive to supply current to base 78.

Gate-controlled bipolar junction transistor 74 thus has two inputs, namely the signal on lead 91 to gate 79 and the signal on lead 94. For instance, assuming that the threshold voltage of n channel 97 is 1.2 V and of p channel 78 is 0.5 V, a zero gate voltage on lead 91 can turn the p channel 78 on and hence form lateral npn bipolar transistor 74. If the base contact, lead 94, connected to p+ region 80 and in turn to p channel 78 is positive, then lateral npn bipolar transistor 81 is on. If lead 94 is 0 V, then transistor 81 is off. If the gate voltage on lead 91 is positive, then n channel 97 is on and emitter 76 and collector 77 are shorted together. Hence, lateral npn bipolar transistor 74 is on except in the case where both lead 91 (gate 79) and lead 94 (base 78) voltages are zero. Gate-controlled bipolar junction transistor 74 thus may be used to perform a logic OR function.

Figure 7:
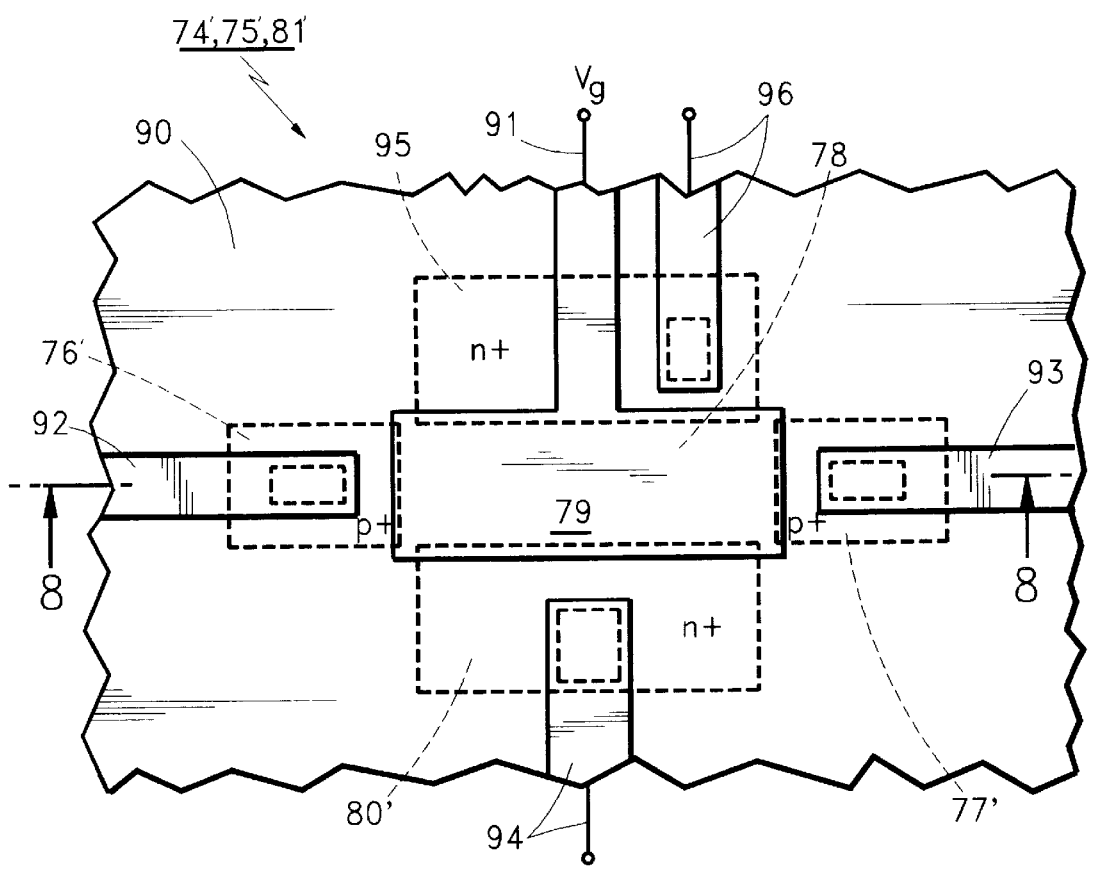
FIG. 7 is a top view of a third embodiment of the invention.
Figure 8:
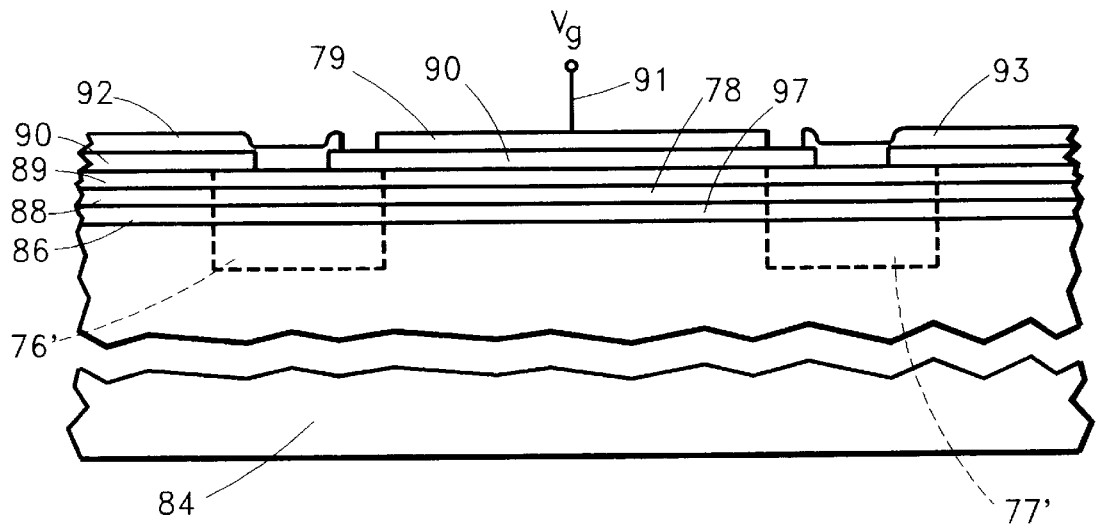
FIG. 8 is a cross section view along the line 8—8 of FIG. 7.

FIG. 7 shows a top view of gate-controlled lateral bipolar transistor 74'. FIG. 8 shows a cross section view along the line 8—8 of FIG. 7. In FIGS. 7 and 8, like references are used for functions corresponding to the apparatus of FIGS. 5 and 6. In FIGS. 7 and 8, regions 76' and 77' are p+ to form the emitter and collector respectively of gate-controlled lateral bipolar transistor 81'. Region 80' is n+ and forms the source of MOS transistor 75'. Further, an additional n+ region 95 may be formed across channel 78' from region 80' and aligned with gate 79 to form an additional source for supplying base current to transistor 81'. Source region 95 is coupled to lead 96 which is in ohmic contact to region 95. It is understood that source region 95 may also be a drain region; gate 79 controls the conductivity of the channel between regions 80' and 95. Region 95 may serve as a third logic input or as a redundant second input for gate-controlled lateral bipolar transistor 74'.

In operation of gate controlled bipolar junction transistor 74' and assuming that the threshold voltage of n channel 97 is 1.2 V and of p channel 78 is 0.5 V, a positive gate voltage on lead 91 can turn n channel 97 on and hence form a lateral pnp bipolar transistor 81'. If the base contact or the voltage on lead 94 or lead 96 connected to n channel 97 is negative to supply current, then the lateral bipolar transistor 81' is on, otherwise it is off. If the gate voltage on lead 91 is zero, the p channel 78 is on and the emitter and collector are shorted together and the transistor 81' is on. This means that transistor 74' is on except when a positive gate voltage and a positive base voltage are applied. Transistor 74' thus performs a logic NAND function.

Gate controlled bipolar junction transistors 74 and 74' perform the logic functions OR and NAND respectively and are compatible since transistors 74 and 74' operate with the same threshold voltages, and thus may be combined together in the same circuit or chip in order to achieve any logic function. The use of the logic functions OR and NAND incorporated in gate controlled lateral bipolar transistors 74 and 74' as described above provide increased packing density of logic functions on a chip.

While there has been described and illustrated a dual transistor structure, one with two MOS transistors to form for example a CMOS inverter and one with a MOS transistor and a lateral bipolar transistor to form OR and NAND logic functions, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A dual transistor structure comprising:
   a single crystalline substrate;
   a first epitaxial layer of a first conductivity type of semiconductor material formed on said substrate, said first epitaxial layer including a first region and a second region of a second conductivity type, said first and second regions spaced apart to form source and drain regions, respectively;
   a graded epitaxial layer of $Si_{1-x}Ge_x$ between said substrate and said first epitaxial layer having a top surface with a larger lattice spacing than the lattice spacing of said first layer whereby said first layer is under tension;
   an epitaxial buffer layer over said first epitaxial layer;
   a second epitaxial layer of said second conductivity type of semiconductor material over said epitaxial buffer layer, said second epitaxial layer including a first region and a second region of said first conductivity type, said first and second regions are spaced apart to form source and drain regions, respectively;
   a dielectric layer over said second epitaxial layer; and
   a gate electrode on said dielectric layer, said gate electrode positioned over a path between said first and second regions of said second conductivity type and a path between said first and second regions of said first conductivity type.

2. The dual transistor structure of claim 1 wherein said second region of second conductivity type and said second region of first conductivity type are coupled together.

3. The dual transistor structure of claim 1 wherein said second region of second conductivity type and said second region of first conductivity type are coupled together for providing an output, said first region of second conductivity type adapted for coupling to a first voltage supply, said second second region of first conductivity type adapted for coupling to a second voltage supply, and said gate electrode adapted for coupling to an input signal.

4. The dual transistor structure of claim 3 wherein said gate electrode is coupled to a source of digital signals whereby an input logic level is inverted at the output at times said first and second voltage supplies provide respective voltages.

5. The dual transistor structure of claim 1 wherein said first conductivity type is n type.

6. The dual transistor structure of claim 1 wherein said first epitaxial layer is selected from the group consisting of Si and SiGe.

7. The dual transistor structure of claim 1 wherein said first conductivity type is p type.

8. The dual transistor structure of claim 1 wherein said second epitaxial layer is SiGe having a lattice spacing larger than the lattice spacing of said epitaxial buffer layer whereby said second epitaxial layer is under compression.

9. A gate controlled lateral bipolar transistor comprising:
   a single crystalline substrate;
   a first epitaxial layer of a first conductivity type of semiconductor material formed on said substrate;
   a second epitaxial layer of a second conductivity type of semiconductor material formed on said first epitaxial layer;
   a third layer of dielectric material formed over said second epitaxial layer;
   a first gate electrode formed on said third layer;
   first and second spaced apart regions of one of said first and second conductivity types formed in at least one of said first and second layers on either side of said first gate electrode to function as an emitter and collector respectively of a lateral bipolar transistor; and
   a third region of a conductivity type different from and spaced apart from said first and second spaced apart regions formed in at least the other one of said first and second layers positioned on a side of said first gate electrode to function as a source of an MOS transistor.

10. The gate controlled lateral bipolar transistor of claim 9 wherein said first conductivity type is n type and said second conductivity type is p type.

11. The gate controlled later bipolar transistor of claim 9 wherein said first conductivity type is p type and said second conductivity type is n type.

12. The gate controlled lateral bipolar transistor of claim 9 further including a fourth region of a conductivity type, the same conductivity type as said third region, formed in at least the same layer as said third region and positioned on a side of said gate electrode to function as an additional source of an MOS transistor and adapted for connecting to a digital signal.

13. The gate controlled lateral bipolar transistor of claim 9 wherein said gate electrode and said third region are adapted for coupling to respective digital signals.

14. The gate controlled lateral bipolar transistor of claim 9 further including:

a second gate spaced from said first gate electrode formed on said third layer, fourth and fifth spaced apart regions of one of said first and second conductivity types formed in at least one of said first and second layers on either side of said second gate electrode to function as an emitter and collector respectively of a second lateral bipolar transistor, and a sixth region of a conductivity type different from and spaced apart from said fourth and fifth spaced apart regions formed in at least the other one of said first and second layers positioned on a side of said second gate electrode to function as a source of a MOS transistor.

15. The gate controlled lateral bipolar transistor of claim 14 wherein said first conductivity type is n type and said second conductivity type is p type.

16. The gate controlled lateral bipolar transistor of claim 14 wherein said second gate and said sixth regions are adapted for coupling to respective digital signals.

* * * * *